United States Patent
Tihanyi

(10) Patent No.: US 6,445,038 B1
(45) Date of Patent: Sep. 3, 2002

(54) SILICON ON INSULATOR HIGH-VOLTAGE SWITCH

(75) Inventor: Jenoe Tihanyi, Kirchheim (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/600,004

(22) PCT Filed: Dec. 7, 1998

(86) PCT No.: PCT/DE98/03592

§ 371 (c)(1),
(2), (4) Date: Sep. 27, 2000

(87) PCT Pub. No.: WO99/35695

PCT Pub. Date: Jul. 15, 1999

(30) Foreign Application Priority Data

Jan. 9, 1998 (DE) .............................. 198 00 647

(51) Int. Cl.[7] .............................. H09V 27/01
(52) U.S. Cl. .......................... 257/347; 257/339
(58) Field of Search ................ 257/475, 630, 257/306, 341, 476, 334, 508, 347, 339

(56) References Cited

U.S. PATENT DOCUMENTS

| | | | |
|---|---|---|---|
| 5,111,254 A | | 5/1992 | Levinson et al. |
| 5,365,102 A | * | 11/1994 | Mehrotra et al. ............ 257/475 |
| 5,731,627 A | * | 3/1998 | Seok ........................ 257/630 |
| 5,986,301 A | * | 11/1999 | Fukushima et al. .......... 257/306 |
| 6,049,108 A | * | 4/2000 | Williams et al. ............ 257/341 |
| 6,078,090 A | * | 6/2000 | Williams et al. ............ 257/476 |
| 6,163,052 A | * | 12/2000 | Liu et al. ................... 257/334 |
| 6,246,101 B1 | * | 6/2001 | Akiyama et al. ........... 257/508 |

FOREIGN PATENT DOCUMENTS

| | | |
|---|---|---|
| EP | 0 526 939 | 2/1993 |
| EP | 0 549 042 | 6/1993 |
| EP | 0 344 514 | 10/1994 |
| EP | 0 638 938 A2 | 2/1995 |
| EP | 0 497 427 | 4/1996 |
| JP | 62-18768 | 1/1987 |

OTHER PUBLICATIONS

Patent Abstracts of Japan—62018768.
"A High Voltage Bulk MESFET Using In–Situ Junctions", Levinson et al., pp. 347–351.
High Voltage Semiconductor Metal Eutectic Transistors for Pulsed Power Switching Applications, Nguyen et al., pp. 274–277.

* cited by examiner

*Primary Examiner*—David Nelms
*Assistant Examiner*—Bau Le
(74) *Attorney, Agent, or Firm*—Schiff Hardin & Waite

(57) ABSTRACT

An SOI high-voltage switch with an FET structure, in which a drift zone of one conductivity type is provided between a gate electrode and a drain electrode in the drain region. Pillar-like trenches in the form of a grid are incorporated in the drift zone and are filled with semiconductor material of the other conductivity type.

13 Claims, 4 Drawing Sheets

SILICON ON INSULATOR HIGH-VOLTAGE SWITCH

BACKGROUND OF THE INVENTION

1. Field of the Invention

The present invention relates to an SOI high-voltage switch with a FET structure in which a drift zone of one conductivity type is provided between a gate electrode and a drain electrode in the drain region.

2. Background of the Invention

SOI structures are particularly suited for integrated circuits operated with high voltage (HV-IC). This is because, under certain circumstances, such HV-ICs can serve as full bridges with driver functions on a chip. A precondition to this, however, is that lateral SOI structures which are required for such applications have relatively high-impedance drift zones in their drain region.

This problem already has been known for a sum time in the case of vertical structures in order, for example in the context of switching off GTO thyristors, to prevent a decrease in the gate turn-off current as the voltage rises. In addition to field rings, freely floating regions of the second conductivity type are inserted into the region of space charge zones in a substrate of the first conductivity type, the doping of these freely floating regions being performed in such a way that doping reversal of the substrate is always ensured (cf. EP 0 344 514 B1). Moreover, in the case of an SOI thin-film transistor, it is known to provide a drift zone with a linear doping profile in order to improve the dielectric strength (cf. EP 0 497 427 B1).

The first-mentioned measure, that of the introduction of a freely floating region, does not take account of the specific requirements of lateral arrangements and does not give attention to the configuration of the edge of the FET structure. The second measure, that of the provision of a linear doping profile in the region of the drift zone, is relatively complicated and requires adaptation to the extent of the drift zone.

Taking such prior art as a starting point, an object of the present invention is to provide an SOI high-voltage switch which can be produced in a simple manner for practically any desired lateral extent and which has a high dielectric strength.

SUMMARY OF THE INVENTION

In the case of an SOI high-voltage switch of the type mentioned in the introduction, this object is achieved according to the invention by virtue of the fact that pillar-like trenches are incorporated in the drift zone and filled with semiconductor material of the other conductivity type.

These trenches, which preferably are filled with polycrystalline silicon which is doped with dopant of the other conductivity type, are arranged, for example, in rows in a grid-like manner. The distance between the rows running in the direction perpendicular to the connection direction between drain and source is approximately 3 to 30 $\mu$m, preferably 6 to 10 $\mu$m, in the case of n-type doping of the drift zone of approximately $2 \times 10^{15}$ cm$^{-3}$. The distance between the trenches in a row may be approximately 2 to 5 $\mu$m if the trenches, which may have a circular or rectangular cross section, have cross-sectional dimensions of about 0.1 to 3 $\mu$m, in particular 1 to 2 $\mu$m.

In order to increase the dielectric strength further, field plates additionally may be provided in the edge region on the surface, which field plates are to be connected to gate or source of the SOI high-voltage switch.

The individual trenches are introduced all at once into the drift zone, for example by etching, and subsequently are filled with p-doped polycrystalline silicon, if the drift zone is n-doped. In the event of a thermal treatment, the dopant penetrates out from the polycrystalline silicon, such that there are a number of "plug" or "dumpling" like sources of p-type dopant, for example boron, in the n-conducting drift zone. It is therefor, possible to dope the drift zone more highly without risking a reduction in the dielectric strength.

The trenches are specifically arranged in such a way that those regions of the drift zone which lie between them, so-called intermediate zones, are depleted of charge carriers beforehand, in the event of positive drain voltage being applied to the n$^+$-conducting drain zone or the n-conducting drift zone, before a breakdown can occur between the p-conducting trench and the n-conducting surroundings of the drift zone.

The principle of the present invention, that is the introduction of individual trenches in a drift zone of one conductivity type wherein the trenches are arranged in a grid-like manner and filled with semiconductor material of the other conductivity type, can be applied not only to SOI-FETs but also, for example, to SOI-IGBTs (insulating gate bipolar transistors), if a high current-carrying capacity is sought even at relatively high voltages.

Additional features and advantages of the present invention are described in, and will be apparent form, the following detailed description of the preferred embodiments in the drawings.

DETAILED DESCRIPTION OF THE PREFERRED EMBODIMENTS

Figure 1:
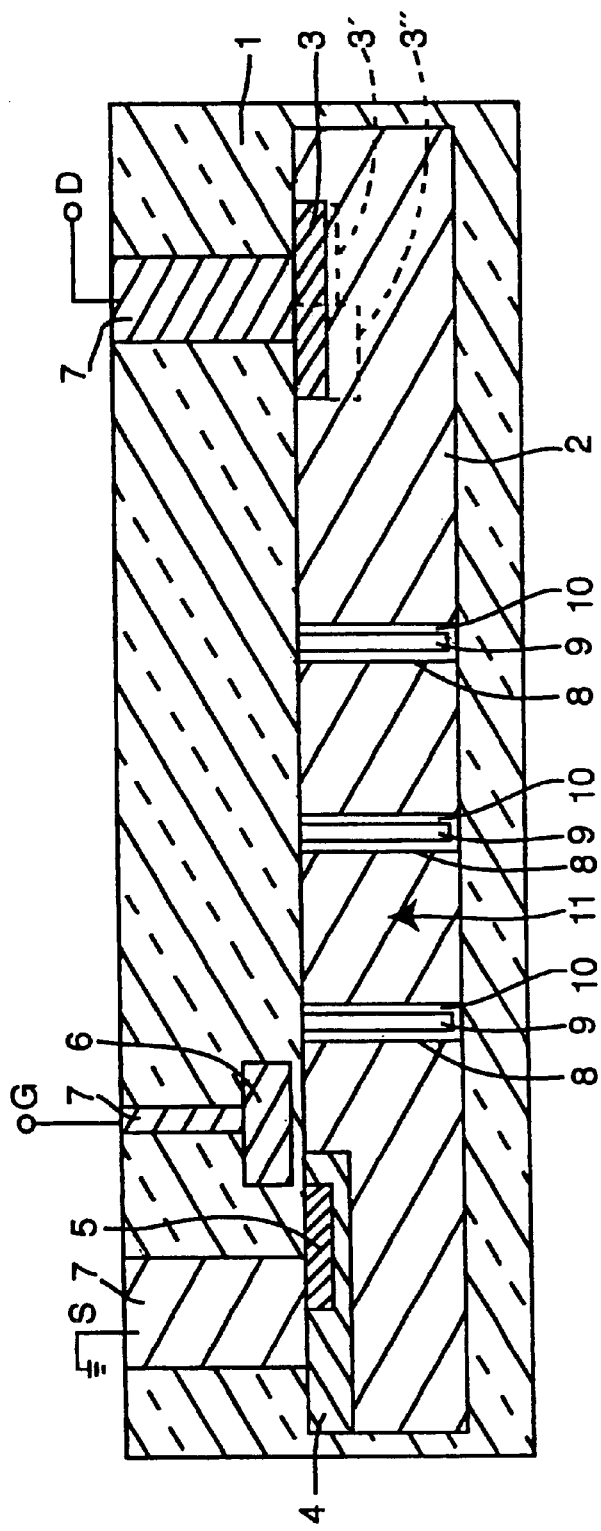
FIG. 1 shows a section through an SOI high-voltage switch with an FET structure as a first exemplary embodiment of the present invention.

FIG. 1 shows a section through an SOI-HV-FET structure having an insulator layer 1, in which a monocrystalline silicon layer 2 ("island") is embedded. This island has, for example a layer thickness of approximately 20 $\mu$m, and is n-doped. In this case, the doping concentration may be approximately $2 \times 10^{15}$ cm$^{-3}$. It goes without saying that other layer thicknesses and doping concentrations are also possible for the semiconductor layer 2; thus, by way of example, values of between 1 and 50 $\mu$m are conceivable for the layer thickness.

An n$^+$-doped drain zone 3 is situated in the semiconductor layer 2. The drain also may include a so-called Schottky contact, that is a contact between metal and silicon, or a combination of an n$^+$-conducting zone 3' and a p$^+$-conducting zone 3", as is indicated by dashed lines in FIG. 1. In the case of a Schottky contact, the latter is arranged on the semiconductor layer 2 (in that case the zone 3 is thus omitted in FIG. 1), while the n$^+$-conducting zone 3' and the p$^+$-conducting zone 3" can be contact-connected such that they are short-circuited (as illustrated) or are isolated. In addition, a p-doped well 4 and an n$^+$-doped source zone 5 are provided in a customary manner.

A gate 6 preferably is composed of n+-doped polycrystalline silicon and is connected to a gate electrode G via a metallization layer 7 made of aluminum, for example. In a similar manner, further metallization layers 7 connect the source zone 5 and the drain zone 3 to a source electrode S, which is grounded, and a drain electrode D at which a positive voltage is present.

According to the present invention, in the drift zone-forming region of the semiconductor layer 2 between gate 6 and drain zone 3, trenches 8 are provided which are arranged in a grid-like manner and which are filled with p-conducting semiconductor material. Such trenches have, by way of example, a p+-doped polycrystalline silicon filling 9, from which the p-conducting dopant, for example boron, is out-diffused into the surrounding semiconductor layer 2, such that p-conducting regions 10 are produced there.

Figure 2:
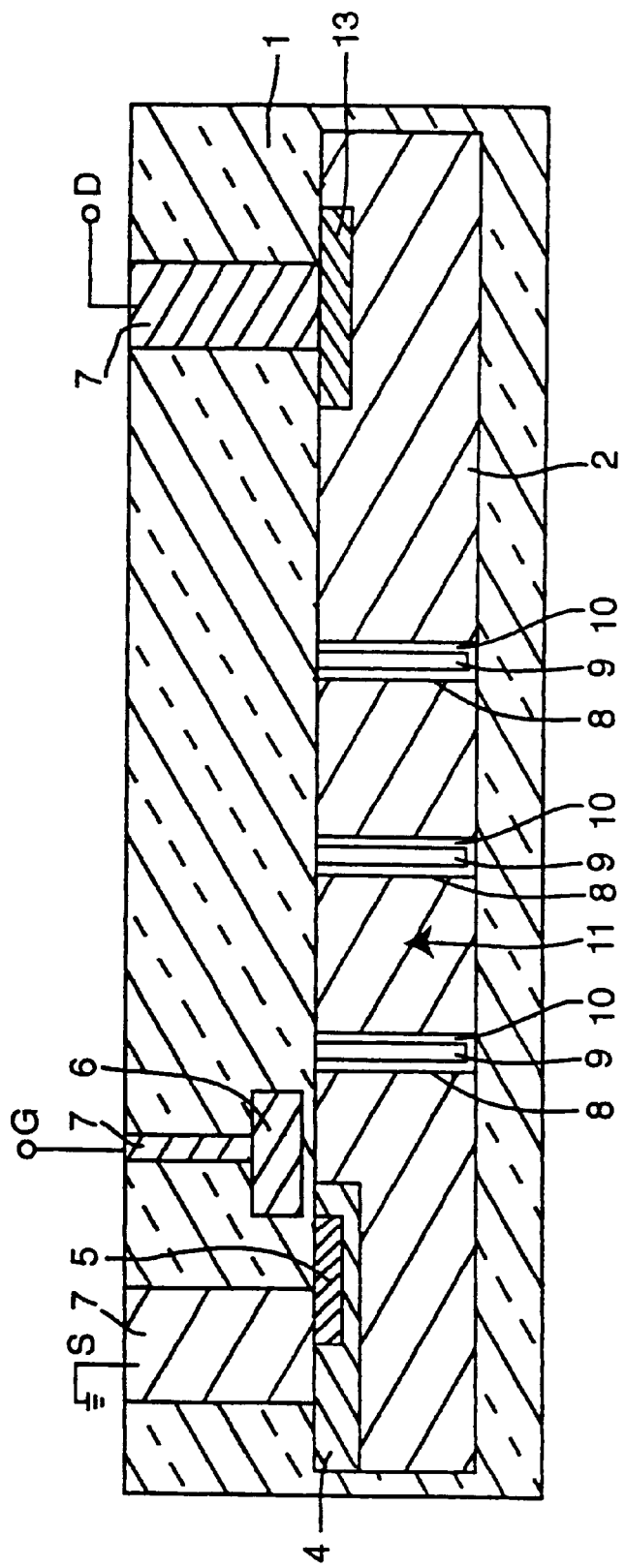
FIG. 2 shows a section which is similar to FIG. 1, through an SOI high-voltage IGBT according to a second exemplary embodiment of the present invention.

FIG. 2 shows a section through a high-voltage IGBT in which a drain zone 13 is p-doped.

Figure 3:
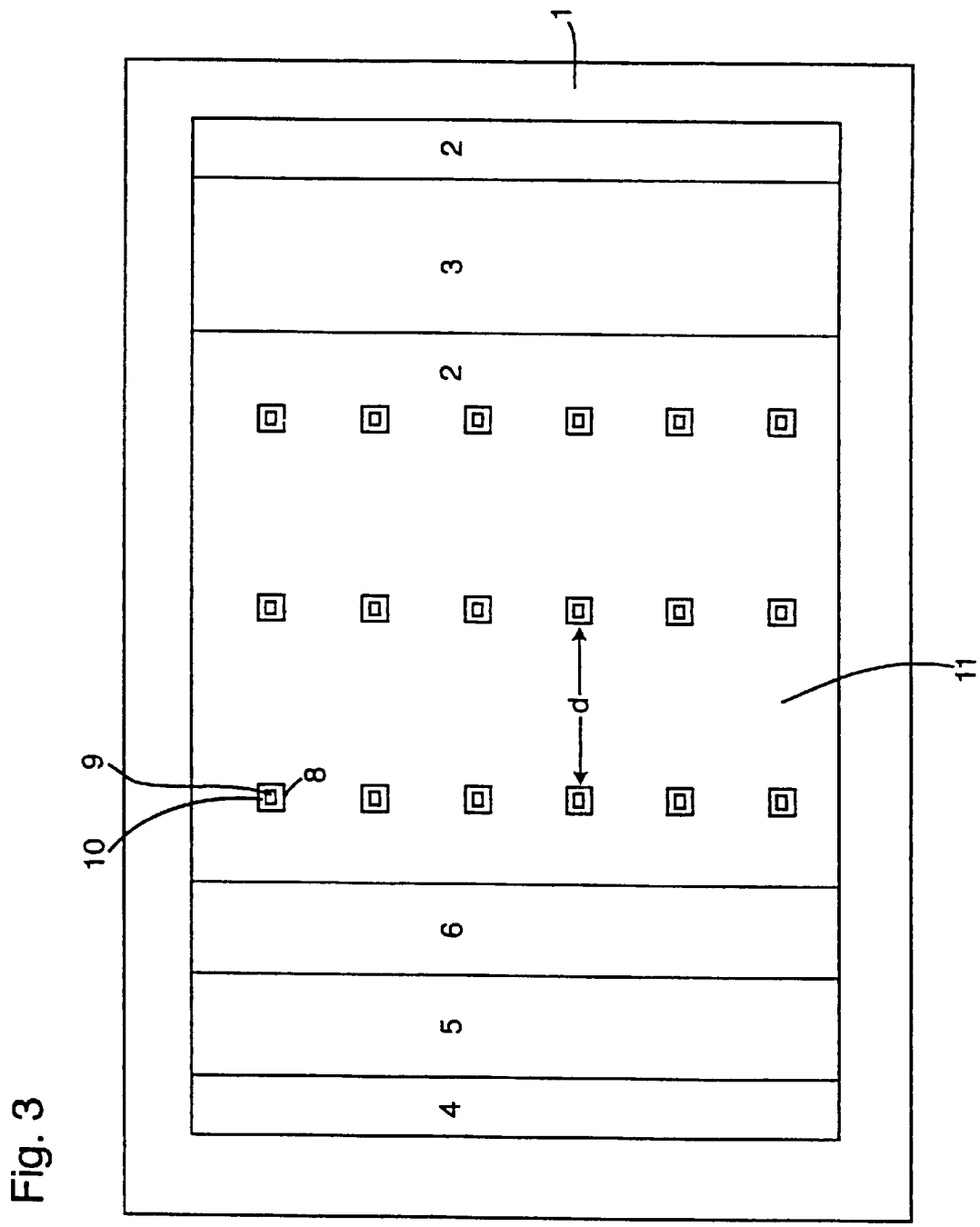
FIG. 3 shows a plan view of an SOI high-voltage switch according to the present invention.

FIG. 3 shows a plan view ("layout") of an SOI-HV-FET structure in accordance with the arrangement of FIG. 1, the wherein insulator layer 1 and the metallization layers 7 have been partly omitted in order to clarify the illustration. As is now evident from FIG. 3, the trenches 8 form a grid of individual "pillar" or "dumpling" like regions 10 with p-conducting dopant in the drift zone 11 between gate 6 and drain zone 3. The distance d between the individual rows is approximately 3 to 30 μm, preferably 5 to 10 μm, if the doping concentration in the drift zone 11 has a value of twice $10^{15}$ cm$^{-3}$. In the individual rows, the trenches 8 have a spacing between one another of approximately 2 to 5 μm, while the cross-sectional dimension of a trench 8 has values of from 0.1 to 3 μm, preferably between 1 and 2 μm.

The individual trenches 8 are arranged in such a way that the regions between the rows of these trenches, so-called intermediate zones, are depleted of charge carriers beforehand, in the event of positive drain voltage being applied, before a breakdown can occur between the p-conducting region 10 and the n-conducting surroundings of the drift zone 11. However, it is also possible for the drain zone or electrode to be arranged in the center of a silicon island, and for source, gate and drift zone to surround drain in the shape of a ring.

Figure 4:
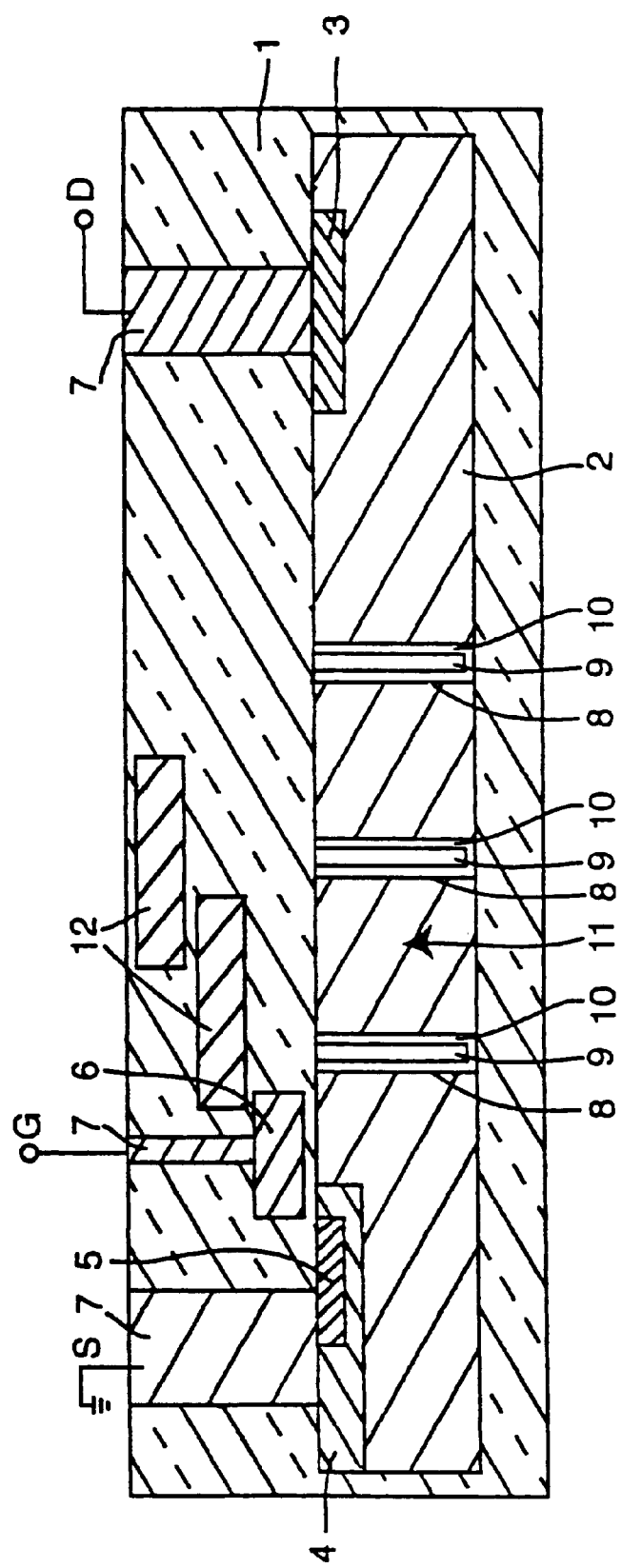
FIG. 4 shows an SOI high-voltage switch with an FET structure and field plates in accordance with a further exemplary embodiment of the present invention.

FIG. 4 shows a further exemplary embodiment of the SOI high-voltage switch according to the present invention, which uses an SOI-HV-FET. The difference from the exemplary embodiment of FIG. 1 is that field plates 12 are additionally provided which further increase the dielectric strength of the edge structure. These field plates 12 may, if appropriate, be connected to gate G or to source S and to one another.

Although the present invention has been described with reference to specific embodiments, those skilled in the art will recognize the changes may be made thereto without departing from the spirit and scope of the invention as set forth in the hereafter appended claims.

I claim:

1. An SOI high-voltage switch with an FET structure, comprising:

a drift zone of a first conductivity type provided between a gate electrode and a drain electrode in a drain region of the FET;

pillar-like trenches formed in the drift zone which are filled with semiconductor material of a second conductivity type which is opposite to the first conductivity type; and a plurality of field plates in a region between the gate electrode and the drain electrode in an insulator layer, the plurality of field plates arranged above one another and offset with respect to one another in a drift direction.

2. An SOI high-voltage switch with an FET structure as claimed in claim 1, wherein the semiconductor material is polycrystalline silicon doped with dopant of the second conductivity type, and wherein surroundings are doped from the polycrystalline silicon by diffusion.

3. An SOI high-voltage switch with an FET structure as claimed in claim 2, wherein the trenches are arranged in rows in a grid-like manner.

4. An SOI high-voltage switch with an FET structure as claimed in claim 3, wherein a distance between the rows running in a direction perpendicular to a connection direction between a drain zone and a source zone is 3 to 30 μm in the case of n-conducting doping of the drift zone of approximately $2 \times 10^{15}$ cm$^{-3}$.

5. An SOI high-voltage switch with an FET structure as claimed in claim 3, wherein a distance between the rows running in a direction perpendicular to a connection direction between a drain zone and a source zone is 5 to 10 μm in the case of n-conducting doping of the drift zone of approximately $2 \times 10^{15}$ cm$^{-3}$.

6. An SOI high-voltage switch with an FET structure as claimed in claim 3, wherein a cross-sectional dimension of the trenches is approximately 0.1 to 3 μm.

7. An SOI high-voltage switch with an FET structure as claimed in claim 3, wherein a cross-sectional dimension of the trenches is approximately 1 to 2 μm.

8. An SOI high-voltage switch with an FET structure as claimed in claim 3, wherein a distance between the trenches in a row is approximately 2 to 5 μm.

9. An SOI high-voltage switch with an FET structure as claimed in claim 1, wherein a region between the trenches is depleted of charge carriers before a breakdown occurs between the trenches and the drift zone in the case of an n-conducting drift zone and a positive drain voltage.

10. An SOI high-voltage switch with an FET structure as claimed in claim 1, wherein the drain zone is formed by a Schottky contact.

11. An SOI high-voltage switch with an FET structure as claimed in claim 1, wherein the drain zone includes an n+-conducting zone and a p+-conducting zone which are contact-connected such that they are short-circuited.

12. An SOI high-voltage switch with an FET structure as claimed in claim 1, wherein the drain zone includes an n+-zone and a p+-conducting zone which are contact-connected such that they are isolated.

13. An SOI high-voltage switch with an FET structure as claimed in claim 1, wherein a source electrode and the gate electrode surround the drain electrode in a closed ring.

* * * * *